US012771364B2

(12) United States Patent
Zhu et al.

(10) Patent No.: US 12,771,364 B2
(45) Date of Patent: Oct. 20, 2026

(54) TIME-INTERLEAVED ADC ERROR PARAMETER EXTRACTION AND CORRECTION METHOD

(71) Applicant: Chengdu Sino Microelectronics Technology Co., Ltd., Chengdu (CN)

(72) Inventors: Xing Zhu, Chengdu (CN); Lei Chen, Chengdu (CN); Pintang Kang, Chengdu (CN); Chuanpeng Tang, Chengdu (CN)

(73) Assignee: Chengdu Sino Microelectronics Technology Co., Ltd., Chengdu (CN)

( * ) Notice: Subject to any disclaimer, the term of this patent is extended or adjusted under 35 U.S.C. 154(b) by 124 days.

(21) Appl. No.: 19/019,432

(22) Filed: Jan. 13, 2025

(65) Prior Publication Data

US 2025/0350290 A1 Nov. 13, 2025

(30) Foreign Application Priority Data

May 8, 2024 (CN) ........................ 202410559425.X

(51) Int. Cl.
*H03M 1/06* (2006.01)
*H03M 1/12* (2006.01)

(52) U.S. Cl.
CPC ....... *H03M 1/0643* (2013.01); *H03M 1/1215* (2013.01)

(58) Field of Classification Search
CPC ............. H03M 1/0643; H03M 1/1215; H03M 1/1009; H03M 1/121
See application file for complete search history.

(56) References Cited

U.S. PATENT DOCUMENTS

| | | | | |
|---|---|---|---|---|
| 7,038,602 B1 * | 5/2006 | Moore | H03M 1/1038 341/120 |
| 7,482,956 B2 * | 1/2009 | Huang | H03M 1/1028 341/120 |
| 9,088,293 B1 * | 7/2015 | D'Souza | H03M 1/0836 |
| 9,143,147 B1 * | 9/2015 | Ray | H03M 1/12 |
| 9,437,212 B1 * | 9/2016 | Jain | G10L 21/0232 |
| 9,866,228 B2 * | 1/2018 | Zortea | H03M 1/1033 |
| 11,070,399 B1 * | 7/2021 | Omer | G01S 5/011 |
| 11,872,060 B2 * | 1/2024 | Han | A61B 5/14551 |
| 2006/0232460 A1 * | 10/2006 | Huang | H03M 1/1019 341/155 |

(Continued)

*Primary Examiner* — Lam T Mai

(74) *Attorney, Agent, or Firm* — Central California IP Group, P.C.; Andrew D. Fortney

(57) ABSTRACT

A time-interleaved ADC error parameter extraction and correction method relates to an error correction technique for an analog-to-digital converter (ADC). This application discloses a method for extracting and correcting error parameters in a time-interleaved ADC, which takes the time-interleaved ADC channel n as the basis or reference channel, and corrects other channels to match the channel n. The steps include: a. Converting a time domain signal output of each ADC channel into a frequency domain signal; b. Calculating one or more error parameters according to the frequency domain signal; c. Correcting the frequency domain signal in one or more different channels according to the error parameter(s); and d. Converting the corrected frequency domain signal into a (corresponding) corrected time domain signal.

16 Claims, 2 Drawing Sheets

(56) References Cited

U.S. PATENT DOCUMENTS

| | | | | |
|---|---|---|---|---|
| 2010/0164763 | A1* | 7/2010 | Kidambi | H03M 1/1028 341/118 |
| 2012/0075129 | A1* | 3/2012 | Kidambi | H03M 1/1052 341/118 |
| 2016/0149582 | A1* | 5/2016 | Ragab | H03M 1/121 341/120 |
| 2018/0233154 | A1* | 8/2018 | Vaillancourt | G10L 19/008 |
| 2019/0222927 | A1* | 7/2019 | Matsuo | H04R 3/005 |
| 2020/0177417 | A1* | 6/2020 | Tangudu | H04B 1/30 |
| 2020/0243102 | A1* | 7/2020 | Schmidt | G06N 20/10 |
| 2021/0159908 | A1* | 5/2021 | Singh | H03M 1/0626 |
| 2024/0196149 | A1* | 6/2024 | Chao | H04R 5/04 |

* cited by examiner

TIME-INTERLEAVED ADC ERROR PARAMETER EXTRACTION AND CORRECTION METHOD

CROSS-REFERENCE TO RELATED APPLICATIONS

This application claims the benefit of Chinese Pat. Appl. No. 202410559425.X, filed on May 8, 2024, incorporated herein by reference as if fully set forth herein.

TECHNICAL FIELD

This application relates to the technical field of integrated circuit design, in particular to error correction technology for analog-to-digital converters, in particular to an error parameter extraction and correction method for time-interlaced or time-multiplexed ADCs.

BACKGROUND

After long-term research in academia and industry, various structures of single-channel analog-to-digital converters (ADCs) are becoming more and more mature, and they are approaching the performance limits under existing technical conditions in terms of speed and accuracy. The time-interleaved ADC (TI-ADC), with a multi-channel, parallel time-interleaved (or -multiplexed) structure, has become an inevitable direction to break the bottleneck of single-channel ADC conversion speeds.

A time-interleaved ADC includes M parallel ADC channels that, in turn, sample the same input signal. Ideally, the performance of each subchannel is perfectly matched, and the sampling time is evenly staggered. However, due to limitations in the actual circuits, there may be DC offset variances or errors, gain variances or errors, bandwidth variances or errors, and sampling time variances or errors among the channels, which can seriously restrict the performance of multi-channel time-interleaved ADCs.

At present, the calibration of DC offset is mainly carried out by determining the mean value. That is, by integrating the subchannel ADC output signals or code for a long time, the DC offset error in the system can be obtained, and the subchannel DC offset errors or variances can be corrected using this error parameter.

For the calibration of the channel gain, the prior art mainly estimates the average power of the output signal of each channel, and the average power error or variance between channels is considered as the gain error. Taking a subchannel $ADC_i$ and a reference channel ADC0 in a TI-ADC as an example, the amplitude of the digital output of the i-th channel may be different from that of the digital output of reference channel 0, and the difference is accumulated after appropriate scaling. When the algorithm converges, the input mean of the accumulator in the feedback loop is set to 0, and the output is stable at the ratio of the gain of the two channels. This ratio is multiplied by the raw digital output of the i-th channel, just compensating its gain to 1, and the inter-channel gain error or variation is thus corrected. The same algorithm is used to correct the other channels successively, and finally the gain error of TI-ADC is minimized or eliminated.

The disadvantage of this calibration method is that if the input signal frequency is $f_s/2M$ (where M is the number of channels and $f_s$ is the sampling rate of the time-interleaved ADC), even if there is no gain error, the digital power estimate of the signal can change with the sampling time, and the power error cannot be correctly estimated.

At present, a mixed-signal calibration algorithm is mainly used to calibrate the errors caused by the deviation of the sampling time of the channel(s). In the digital domain, the sampling time deviation is estimated by autocorrelation, and according to the estimated result, the sampling time of the channel is adjusted in the analog domain, and the sampling time error is finally calibrated.

The disadvantage of this calibration method is that it requires high analog circuit precision, and the accuracy of the adjustment in the analog domain determines the performance of sampling time error calibration.

For the bandwidth error, under reasonable area and power consumption, the influence of inter-channel bandwidth errors is difficult, and sometimes nearly impossible, to correct in a later stage. At present, the main method is to maximize the sampling bandwidth of each subchannel to make it much higher than the input signal bandwidth, so as to minimize the influence of bandwidth error.

There are still some problems in the time-interleaved ADC error correction methods of the prior art. The disadvantage of the DC offset error calibration method is that the error cannot be distinguished from the DC input signal, which may result in the elimination of the DC signal. The estimation and calibration of gain error can only be carried out after the offset correction, and is thus affected by the accuracy of the offset correction. The correction method of errors caused by sampling time deviation requires high precision of the analog circuitry. Although existing technology can minimize the influence of bandwidth error through certain techniques, it has not corrected bandwidth errors.

SUMMARY

The main purpose of this application is to provide a time-interleaved (or time-multiplexed) analog-to-digital converter (ADC) error parameter extraction and correction method, to overcome the above shortcomings of the prior art correction methods.

In order to achieve the above purpose, a method for extracting and correcting error parameters in a time-interleaved ADC is provided according to one aspect of the specific implementations of this application. Its feature is that an n-th channel of the time-interleaved ADC is taken as a basis (e.g., as a reference to extract errors or variations in other channels), and the other channels are calibrated and/or corrected to more closely match the n-th channel. The steps of the method include the following:

a. Converting a time domain signal output from each ADC channel into a frequency domain signal;
b. Calculating one or more error parameters according to the frequency domain signal(s) (e.g., in one or more of the multiple channels of the TI-ADC);
c. Correcting the frequency domain signal(s) in one or more different channels (e.g., a subset of the channels of the TI-ADC other than the n-th channel) according to the error parameter(s); and
d. Converting the corrected frequency domain signal(s) into one or more corrected time domain signals (e.g., converting each corrected frequency domain signal into a corresponding corrected time domain signal).

In one embodiment, n=1.

In another embodiment, step b also includes correcting the error parameter(s) according to a change in a process-voltage-temperature (PVT) parameter.

In another embodiment, the error parameter(s) are corrected by a least mean square (LMS) method or algorithm.

In another embodiment, the error parameter(s) include a DC offset error parameter (e.g., $o_m(0)$), an amplitude error parameter (e.g., $A_m(f)$), and a phase error parameter (e.g., $P_m(f)$).

In various embodiments, the DC bias error parameter $o_m(0)$, the amplitude error parameter $A_m(f)$ and the phase error parameter $P_m(f)$ satisfy the following equations or formulas:

$$o_m(0) = Y_m(0);$$

$$A_m(f) = \text{abs}\,(Y_m(f))/\text{abs}\,(Y_n(f));$$

$$P_m(f) = \text{phase}\,(Y_m(f)) + \text{phase}\left(e^{-j2\pi f\left(\frac{T_{CK}}{M}\right)}\right) - \text{phase}\,(Y_n(f));$$

wherein m is the channel order number, m=1, . . . . M, M≠n, and M is the number of channels; abs represents a modulus (or modulo) of a complex number (e.g., $Y_n(f)$ and $Y_m(0)$ are complex numbers); phase indicates the angle at which the complex number (e.g., $Y_n(f)$ or $Y_m(0)$) is taken; $Y_m(f)$ represents the frequency domain equation of the output signal (e.g., the frequency domain signal) of an m-th channel (e.g., for an input signal x(t)); $Y_n(f)$ represents the frequency domain equation of the output signal (e.g., the frequency domain signal) of the n-th channel (e.g., of the TI-ADC, for the input signal x(t)); and $Y_n(0)$ and $Y_m(0)$ represent the value of the frequency domain equations (e.g., the frequency domain signals) of the n-th and m-th channels, respectively (e.g., when f=0).

In some embodiments, the input signal x(t) (e.g., to the time-interleaved ADC or the channels thereof) is a sinusoidal signal satisfying an equation or formula:

$$x(t) = A\sin(\omega t + \varphi);$$

wherein A is an amplitude of the sinusoidal signal, ω is a frequency of the sinusoidal signal, and φ is an initial phase of the sinusoidal signal.

In one or more other or further embodiments, step c may comprise:

Correcting a DC bias error by subtracting the DC offset error parameter (e.g., $o_m(0)$) in the frequency domain, correcting the amplitude error by multiplying a correction coefficient $1/A_m(f)$ (or dividing a correction coefficient $A_m(f)$) at each frequency point in the frequency domain, and correcting the phase error by multiplying a phase shift coefficient $e^{jP_m(f)}$ at each frequency point in the frequency domain. One expression for correcting the DC bias, amplitude and phase errors in such a manner is the equation or formula:

$$Y'_m(f) = (Y_m(f) - o_m(0)) * e^{jP_m(f)}/A_m(f)$$

wherein $$Y'_m(f)$$

is an equation of the output signal of the m-th channel in the frequency domain after correction (e.g., the corrected frequency domain signal in or from m-th channel).

Based on the proposed technical scheme and its further improvement(s) in certain exemplary embodiments, the present application has the following beneficial effects:

1. The corrections of DC offset error, amplitude error and phase error are relatively independent and will generally not affect each other;
2. DC offset error correction does not affect the DC signal;
3. The bandwidth error can be estimated and corrected;
4. By means of digital compensation in the frequency domain, the shortcomings of compensating for PVT changes or variations in the analog domain and the shortcomings of digital time-domain compensation not compensating for frequency-related errors can be avoided. In the frequency domain, the amplitude error and phase error can be compensated for each frequency point to correct the bandwidth error, and the resolution of the frequency domain conversion can be adjusted to flexibly adjust power consumption and chip area (e.g., in accordance with design choices and/or targets for correction accuracy); and
5. The power consumption and chip area can be flexibly adjusted by adjusting the resolution of frequency domain conversion (e.g., in accordance with design choices and/or targets for correction accuracy).

The following is a further explanation of this application in combination with the attached drawings and specific implementation methods. The additional aspects and advantages of this application will be partially given in the description below, and partially will become apparent from the description below, or will become known through the practice of this application.

BRIEF DESCRIPTION OF THE DRAWINGS

The drawings that form part of this application are used to provide further understanding of this application, and the specific embodiments, schematic embodiments and descriptions of this application are used to interpret this application and do not constitute limitations of this application. In the drawings.

EMBODIMENTS

It should be noted that specific embodiments, exemplary embodiments, and features therein in this application may be combined without conflict. This application is described in detail with reference to the attached drawings and in conjunction with the following.

In order to enable those skilled in the art to better understand the application scheme, the following will be combined with specific embodiments of the application and the attached drawings, to give a clear and complete description of specific embodiments of the application and the technical scheme(s) in the exemplary embodiments. It is readily apparent that the application is not limited to the exemplary embodiments described herein, but extends beyond the described embodiments. Based on the specific embodiments and exemplary embodiments in this application, all other embodiments and embodiments obtained by ordinary skilled personnel in the field without making creative labor shall fall within the scope of protection in this application.

Embodiment

Figure 1:
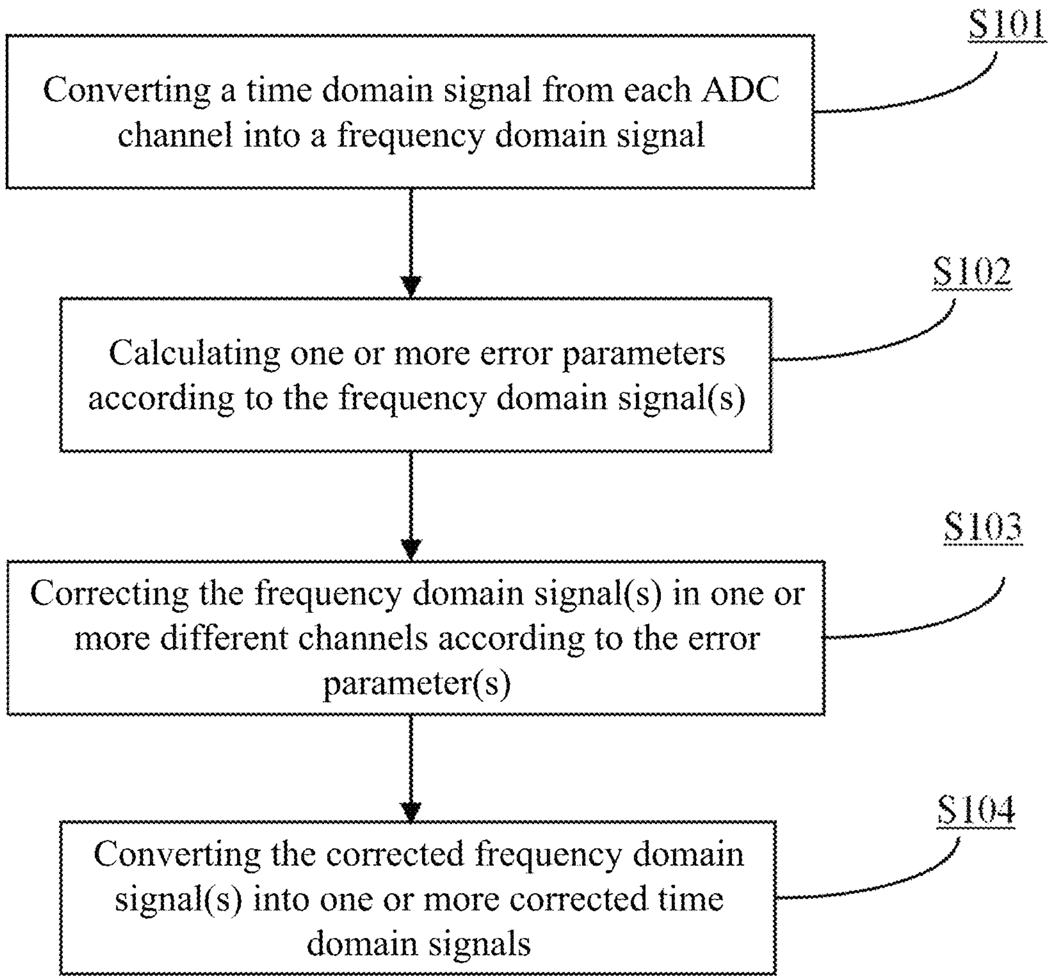
FIG. 1 shows a flow chart of an exemplary time-interleaved ADC error parameter extraction and correction method of one or more embodiments of the present application.
Figure 2:
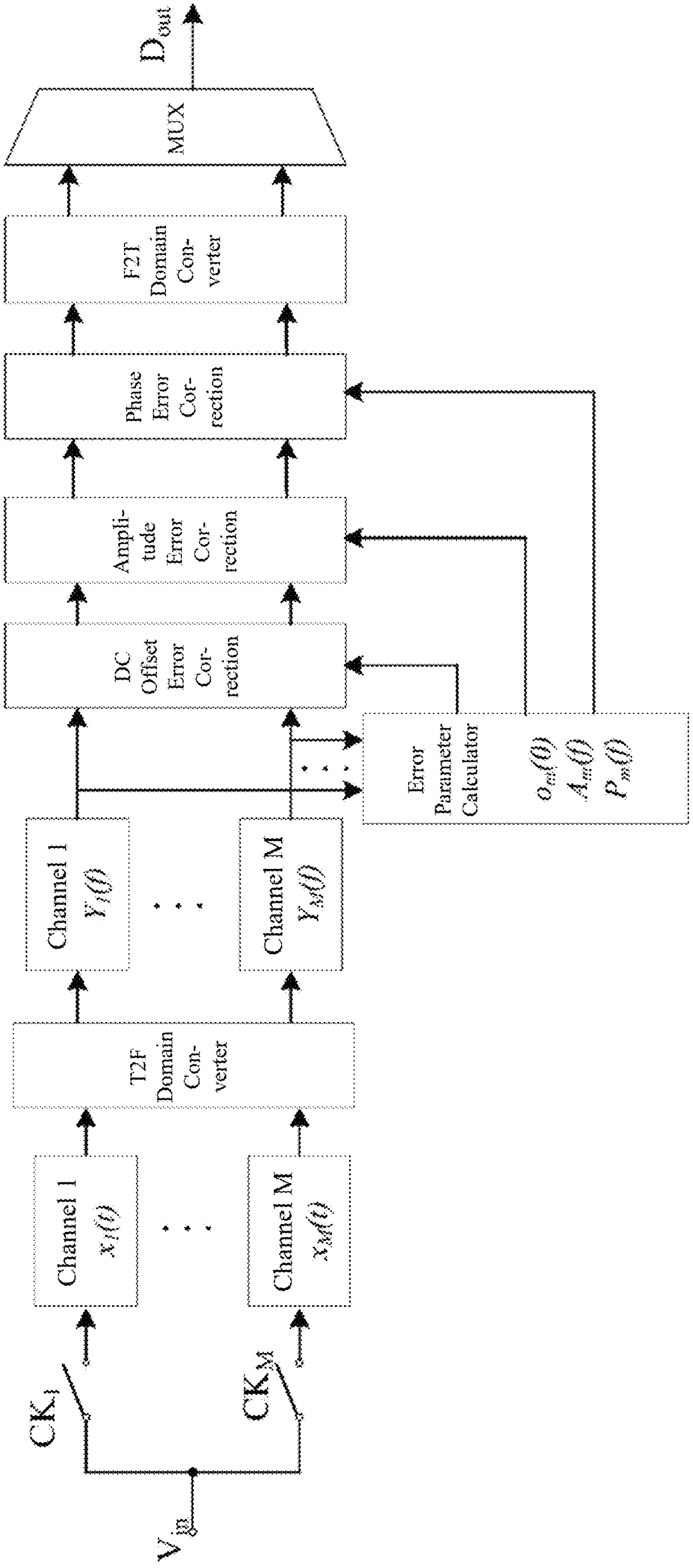
FIG. 2 shows a block diagram and signal flow diagram of an exemplary time-interleaved ADC error parameter extraction and correction circuit and method of one or more embodiments of the present application.

Referring to FIGS. 1 and 2, the process(es) of the time-interleaved (or time-multiplexed) ADC error parameter extraction and correction for specific embodiments of this application are described in detail as follows.

Step S101: Converting a Time Domain Signal from Each Channel of the ADC into a Frequency Domain Signal For a multi-channel time-interleaved ADC (e.g., as shown in FIG. 2), the input signal is x(t). If there is no inter-channel error, the output of each ADC channel is $x_m(t)$, where m is the channel number, m=1, 2 . . . . M, and M is the number of channels.

Let δ(t) be the unit impulse function. The output sequence or number of the k-th sampling period of the ADC channel can be expressed as $x(t)\delta(t-kT_C)$, where $T_C$ is the sampling period of the ADC channel of the time-interleaved ADC. $x(t)\Sigma_k\delta(t-kT_C)$ is the output of the ADC channel for a total of k sampling periods:

$$x_1(t) = x(t)\sum_k \delta(t - kT_C)$$

$$x_2(t) = x(t)\sum_k \delta\left(t - kT_C - \frac{T_C}{M}\right)$$

$$\cdots$$

$$x_M(t) = x(t)\sum_k \delta\left(t - kT_C - \frac{(M-1)T_C}{M}\right)$$

Convert the M-channel ADC output to the frequency domain (e.g., using the time-to-frequency [T2F] converter in FIG. 2) for each channel in the TI-ADC (e.g., Channel 1 through Channel M in FIG. 2), for example according to the following equations or formulas:

$$Y_1(f) = \frac{1}{T_C}X(f) * \sum_k \delta(f - kf_C)$$

$$Y_2(f) = \frac{1}{T_C}X(f) * \sum_k \delta(f - kf_C)e^{-j2\pi f T_C/M}$$

$$\cdots$$

$$Y_M(f) = \frac{1}{T_C}X(f) * \sum_k \delta(f - kf_C)e^{-j2\pi f T_C*(M-1)/M}$$

where X(f) is the frequency domain conversion for x(t), $Y_M(f)$ is the frequency domain conversion for $x_M(t)$, $\delta(f-kf_C)$ is the frequency domain conversion for $\delta(t-kT_C)$, $e^{-j2\pi f T_C*(M-1)/M}$ is the phase shift, fc is the sampling frequency of the time-interleaved ADC, and $T_C$ is the sampling period of the time-interleaved ADC.

Step S102: Calculating One or More Error Parameters According to the Frequency Domain Signal(s)

When there is a DC offset error, a gain error, a deviation in the sampling time and/or a bandwidth error, the frequency domain signal of each ADC channel can be expressed as:

$$Y_1(f) = \frac{1}{T_C}X(f) * \sum_k \delta(f - kf_C)$$

$$Y_2(f) = \frac{(g_2 + G_2(f))}{T_C}X(f) * \sum_k \delta(f - kf_C)e^{-j2\pi f\left(T_C/M + \Delta t_2 + \Delta T_2(f)\right)} + o_2(0)$$

$$\cdots$$

$$Y_M(f) = \frac{(g_M + G_M(f))}{T_C}X(f) * \sum_k \delta(f - kf_C)e^{-j2\pi f\left(T_C*(M-1)/M + \Delta t_M + \Delta T_M(f)\right)} + o_M(0)$$

where $g_2 \ldots g_M$ is the gain error of other channels with respect to Channel 1 (e.g., the deviation in gain between the other channels and Channel 1), $o_2(0) \ldots o_M(0)$ is the DC offset error of other channels with respect to Channel 1 (e.g., the deviation in DC offset between the other channels and Channel 1), $\Delta t_2 \ldots \Delta t_M$ is the deviation in sampling time between the other channels and Channel 1, $G_2(f) \ldots G_M(f)$ is the amplitude error component of the bandwidth error in the other channels relative to the bandwidth error of Channel 1, and $\Delta T_2(f) \ldots \Delta T_M(f)$ is the phase error component of the bandwidth error in the other channels relative to the bandwidth error of Channel 1.

If the amplitude error component of the bandwidth error and the gain error are combined into the amplitude error A(f), and the phase error component of the bandwidth error and the sampling time deviation are combined into the phase error P(f), then the frequency domain signal of each of the other ADC channels (e.g., Channels 2 through M) become:

$$Y_2(f) = \frac{A_2(f)}{T_C}X(f) * \sum_k \delta(f - kf_C)e^{-j2\pi f\left(\frac{T_C}{M}\right)} * e^{-jP_2(f)} + o_2(0)$$

$$\cdots$$

$$Y_m(f) = \frac{A_m(f)}{T_C}X(f) * \sum_k \delta(f - kf_C)e^{-j2\pi f\left(\frac{T_C}{m}\right)} * e^{-jP_m(f)} + o_m(0)$$

$$\cdots$$

$$Y_M(f) = \frac{A_M(f)}{T_C}X(f) * \sum_k \delta(f - kf_C)e^{-j2\pi f\left(\frac{T_C}{M}\right)} * e^{-jP_M(f)} + o_M(0)$$

Where:

$$A_m(f) = g_m + G_m(f)$$

$$P_m(f) = e^{-j2\pi f(\Delta t_m + \Delta T_m(f))}$$

$$m = 2, \ldots, M$$

The above description uses the first channel (Channel 1) as the baseline or a reference channel for error detection and correction, but in the same way, it is also possible to select an n-th channel at random as the baseline or reference channel, and adjust the other channels to match the n-th channel. For example:

$$Y_n(f) = \frac{1}{T_C}X(f) * \sum_k \delta(f - kf_C)$$

$$Y_m(f) = \frac{(g_m + G_m(f))}{T_C}X(f) * \sum_k \delta(f - kf_C)e^{-j2\pi f\left(T_C*\frac{m-1}{M} + \Delta t_m + \Delta T_m(f)\right)} + o_m(0)$$

$$m = 1, \ldots, M,\ m \neq n.$$

The DC offset error, amplitude error and phase error can be obtained by a fast Fourier transform (FFT) as follows:

DC offset error: $o_m(0)$ $$o_m(0) = Y_m(0)$$

Amplitude error: $A_m(f)$ $$A_m(f) = \text{abs}(Y_m(f))/\text{abs}(Y_1(f))$$

Phase error: $P_m(f)$ $$P_m(f) = \text{phase}(Y_m(f)) + \text{phase}\left(e^{-j2\pi f\left(\frac{T_C}{M}\right)}\right) - \text{phase}(Y_1(f))$$

where $\text{abs}(Y_m(0))$ is the modulus (or modulo) of the complex number $Y_m(0)$, and phase $(Y_m(f))$ is the angle of the complex number $Y_m(f)$.

The extraction and correction of the above error parameters are corrected by first sending known signals, such as sinusoidal signals, to calibrate the channels of the TI-ADC. This process can be termed initialization correction. The mathematical expression of a sinusoidal signal is:

$$x(t) = A\sin(\omega t + \varphi)$$

where A is the amplitude of the sinusoidal signal, w is the frequency of the sinusoidal signal, and φ is the initial phase of the sinusoidal signal.

In initialization correction, the ADC data or signal in each channel is converted from the time domain to the frequency domain, and error information such as DC offset error, amplitude error and phase error is extracted from the signal in the frequency domain, and then the frequency domain signal is converted back to the time domain after correction in the frequency domain.

Because the errors (e.g., DC offset, amplitude and phase errors) change slowly with changes or variations in process, voltage and/or temperature (PVT) parameters, a least mean square (LMS) approach (e.g., method or algorithm) may be used to track the errors after initialization.

At time t=0, first perform a fast Fourier transform on time domain data (e.g., in a predetermined period of time, or a segment of predetermined length), and obtain the errors according to the formulas:

$$o_m(0, t) = Y_m(0)$$

$$A_m(f, t) = \text{abs}(Y_m(f))/\text{abs}(Y_1(f))$$

$$P_m(f, t) = \text{phase}(Y_m(f)) + \text{phase}\left(e^{-j2\pi f\left(\frac{T_C}{M}\right)}\right) - \text{phase}(Y_1(f))$$

At time t+1 (e.g., at the end of the first predetermined period of time), the corresponding time domain data is obtained by the fast Fourier transform, and according to the above three formulas, the following is obtained:

$$o_m(0, t+1) = o_m(0, t) + \mu * (Y_m(0, t+1) - -o_m(0, t))$$

$$A_m(f, t+1) = A_m(f, t) + \mu * \left(\text{abs}(Y_m(f, t+1))/\text{abs}(Y_1(f, t+1)) - A_m(f, t)\right)$$

$$P_m(f, t+1) = P_m(f, t) + \mu * \left(\text{phase}(Y_m(f, t+1)) + \text{phase}\left(e^{-j2\pi f\left(\frac{T_C}{M}\right)}\right) - \text{phase}(Y_1(f, t+1)) - P_m(f, t)\right)$$

where μ is a tracking step size parameter (which may be predetermined, or set in advance, and is generally less than 1); $o_m(0, t)$ represents the DC offset error $o_m(0)$ at time (or moment) t; $o_m(0, t+1)$ represents the DC offset error $o_m(0)$ at time (or moment) t+1; $A_m(f, t+1)$ represents the amplitude error $A_m(f)$ at time (or moment) t+1; and $P_m(f, t+1)$ represents the phase error $P_m(f)$ at time (or moment) t+1.

Step S103: Correcting the Frequency Domain Signal(s) in Different Channels According to the Error Parameter(s)

After the above errors are obtained, the errors in the TI-ADC channel output signals are corrected in the frequency domain. The correction process may be expressed in the following formula or equation (1):

$$Y'_m(f) = (Y_m(f) - o_m(0)) * e^{jP_m(f)}/A_m(f) \quad (1)$$

where $Y'_m(f)$ is the frequency domain expression of the output signal of the m-th channel after correction; $Y_m(f)$ represents the frequency domain expression of the output signal of the m-th channel (e.g., before correction, for the input signal x(t)); $o_m(0)$ is the DC offset error parameter; $A_m(f)$ is the amplitude error parameter; and $P_m(f)$ is the phase error parameter.

The present correction method may be based on formula (1), where the DC offset error parameter or correction (a DC offset error $o_m(0)$ is directly subtracted from the channel output signal in the frequency domain, the amplitude error parameter or correction is represented by a coefficient $1/A_m(f)$ by which the channel output signal is multiplied (or, equivalently, a coefficient $A_m(f)$ by which the channel output signal is divided) at each frequency point in the frequency domain, and the phase error parameter or correction is represented by a phase shift coefficient $e^{jP_m(f)}$ by which the channel output signal is multiplied at each frequency point in the frequency domain.

Step S104: Converting the Corrected Frequency Domain Signal(s) into One or More Corrected Time Domain Signals After correction by formula (1), the output signal $Y_m(f)$ in the frequency domain is converted from the frequency domain to the time domain as a corrected time domain signal $x'_m(t)$.

For example, for a 4-channel time-interleaved or time-multiplexed ADC, a sinusoidal signal x(t)=Asine(wt+φ) is input to or received in each channel, and the corrected signal $Y'_m(f)$ for each channel of the TI-ADC may be converted back to the time domain to provide corresponding corrected time domain signals as follows:

$$x_i[n] = \sum_{k=-N}^{N} x[n-k] * w_{i,N+1-k} + w_{i,0}$$

$$x'_1(k) = A\sin(\omega * k/T_C + \varphi);$$

-continued $$x_2'(k)=A\sin(\omega*k/T_C+1/T_C+\varphi);$$

$$x_3'(k)=A\sin(\omega*k/T_C+2/T_C+\varphi);$$

$$x_4'(k)=A\sin(\omega*k/T_C+3/T_C+\varphi).$$

Finally, the time domain expression of the corrected signal for the 4-channel time-interleaved ADC is:

$$x(k)=A\sin(\omega*k/(4*T_C)+\varphi)$$

The invention is not limited to a 4-channel time-interleaved ADC, and can be applied to or incorporated into TI-ADCs having a different number of channels (an integer number≥3, such as 4, 5, 6, 8 or more, and more specifically, $2^x$ channels, where x is an integer of 2 or more, such as 2-7).

What is claimed is:

1. A method of extracting and correcting one or more error parameters in a time-interleaved ADC, wherein the time-interleaved ADC has an n-th channel and other channels to be calibrated and/or corrected to more closely match the n-th channel, comprising:

a. converting a time domain signal output from each channel into a frequency domain signal;

b. calculating one or more error parameters according to the frequency domain signal and correcting the one or more error parameters according to a change in a process-voltage-temperature (PVT) parameter;

c. correcting the frequency domain signal in one or more different channels according to the one or more error parameters; and d. converting the corrected frequency domain signal into one or more corrected time domain signals.

2. The method in claim 1, wherein n=1.

3. The method in claim 1, wherein the one or more error parameters are corrected by a least mean square (LMS) method or algorithm.

4. The method in claim 1, wherein the one or more error parameters include a DC offset error parameter, an amplitude error parameter, and a phase error parameter.

5. The method in claim 4, wherein the DC offset error parameter, the amplitude error parameter, and the phase error parameter satisfy the following equations or formulas:

$$o_m(0)=Y_m(0);$$

$$A_m(f)=\text{abs}(Y_m(f))/\text{abs}(Y_n(f));$$

$$P_m(f)=\text{phase}(Y_m(f))+\text{phase}\left(e^{-j2\pi f\left(\frac{T_{CK}}{M}\right)}\right)-\text{phase}(Y_n(f));$$

wherein m is the channel number, m=1, . . . M, and M≠n; M is the number of channels; abs represents a modulus (or modulo) of a complex number; phase indicates an angle of the complex number; $Y_m(f)$ represents the frequency domain signal of an m-th channel; $Y_n(f)$ represents the frequency domain signal of the n-th channel; and $Y_m(0)$ represents a value of the frequency domain signal of the m-th channel when f=0.

6. The method in claim 5, wherein an input signal to the time-interleaved ADC or the channels thereof is a sinusoidal signal satisfying an equation or formula:

$$x(t)=A\sin(\omega t+\varphi)$$

wherein A is an amplitude of the sinusoidal signal; ω is a frequency of the sinusoidal signal; and φ is an initial phase of the sinusoidal signal.

7. The method in claim 5, wherein correcting the frequency domain signal in one or more different channels comprises:

correcting a DC bias error by subtracting the DC offset error parameter in the frequency domain, correcting an amplitude error by multiplying or dividing by a correction coefficient at each frequency point in the frequency domain, and correcting a phase error by multiplying by a phase shift coefficient at each frequency point in the frequency domain.

8. The method in claim 7, wherein correcting the DC bias error, the amplitude error and the phase error satisfies the equation or formula:

$$Y_m'(f)=(Y_m(f)-o_m(0))*e^{jP_m(f)}/A_m(f);$$

wherein $o_m(0)$ is the DC offset error parameter, $A_m(f)$ is the correction coefficient, $e^{jP_m(f)}$ is the phase shift coefficient, and $$Y_m'(f)$$

is the corrected frequency domain signal of the m-th channel.

9. A method of extracting and correcting one or more error parameters in a time-interleaved ADC, wherein the time-interleaved ADC has an n-th channel and other channels to be calibrated and/or corrected to more closely match the n-th channel, comprising:

converting a time domain signal output from each channel into a frequency domain signal;

calculating a DC offset error parameter, an amplitude error parameter, and a phase error parameter according to the frequency domain signal;

correcting the frequency domain signal in one or more different channels according to the DC offset error parameter, the amplitude error parameter, and the phase error parameter; and converting the corrected frequency domain signal into one or more corrected time domain signals.

10. The method in claim 9, wherein the DC offset error parameter, the amplitude error parameter, and the phase error parameter satisfy the following equations or formulas:

$$o_m(0)=Y_m(0);$$

$$A_m(f)=\text{abs}(Y_m(f))/\text{abs}(Y_n(f));$$

$$P_m(f)=\text{phase}(Y_m(f))+\text{phase}\left(e^{-j2\pi f\left(\frac{T_{CK}}{M}\right)}\right)-\text{phase}(Y_n(f));$$

wherein m is the channel number, m=1, . . . M, and M≠n; M is the number of channels; abs represents a modulus (or modulo) of a complex number; phase indicates an angle of the complex number; $Y_m(f)$ represents the frequency domain signal of an m-th channel; $Y_n(f)$ represents the frequency domain signal of the n-th channel; and $Y_m(0)$ represents a value of the frequency domain signal of the m-th channel when f=0.

11. The method in claim 10, wherein an input signal to the time-interleaved ADC or the channels thereof is a sinusoidal signal satisfying an equation or formula:

$$x(t)=A\sin(\omega t+\varphi);$$

wherein A is an amplitude of the sinusoidal signal; ω is a frequency of the sinusoidal signal; and φ is an initial phase of the sinusoidal signal.

12. The method in claim 10, wherein correcting the frequency domain signal in one or more different channels comprises:

correcting a DC bias error by subtracting the DC offset error parameter in the frequency domain, correcting an amplitude error by multiplying or dividing by a correction coefficient at each frequency point in the frequency domain, and correcting a phase error by multiplying by a phase shift coefficient at each frequency point in the frequency domain.

13. The method in claim 12, wherein correcting the DC bias error, the amplitude error and the phase error satisfies the equation or formula:

$$Y'_m(f)=(Y_m(f)-o_m(0))*e^{jP_m(f)}/A_m(f)$$

wherein $o_m(0)$ is the DC offset error parameter, $A_m(f)$ is the correction coefficient, $e^{jP_m(f)}$ is the phase shift coefficient, and $$Y'_m(f)$$

is the corrected frequency domain signal of the m-th channel.

14. The method in claim 9, wherein n=1.

15. The method in claim 10, wherein n=1.

16. The method in claim 5, wherein n=1.

* * * * *